United States Patent
Yuki et al.

(10) Patent No.: US 9,455,197 B2
(45) Date of Patent: Sep. 27, 2016

(54) METHOD FOR MANUFACTURING SILICON CARBIDE SEMICONDUCTOR DEVICE

(71) Applicant: Mitsubishi Electric Corporation, Tokyo (JP)

(72) Inventors: Hideaki Yuki, Tokyo (JP); Kazuo Kobayashi, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/853,316

(22) Filed: Sep. 14, 2015

(65) Prior Publication Data

US 2016/0181160 A1   Jun. 23, 2016

(30) Foreign Application Priority Data

Dec. 17, 2014   (JP) ................. 2014-254660

(51) Int. Cl.
*H01L 21/3205* (2006.01)
*H01L 21/8234* (2006.01)
*H01L 21/28* (2006.01)
*H01L 29/16* (2006.01)

(52) U.S. Cl.
CPC . *H01L 21/823462* (2013.01); *H01L 21/28202* (2013.01); *H01L 29/1608* (2013.01)

(58) Field of Classification Search
CPC ............... H01L 21/02378; H01L 21/02529; H01L 21/823462; H01L 21/28202; H01L 29/1608
USPC ................... 438/590, 591, 787, 791
See application file for complete search history.

(56) References Cited

U.S. PATENT DOCUMENTS

| 8,753,951 | B2 | 6/2014 | Tanioka et al. | |
| 8,877,656 | B2 * | 11/2014 | Shiomi | H01L 21/324 257/E21.605 |
| 9,209,262 | B2 * | 12/2015 | Tanaka | H01L 21/28 |
| 2012/0009801 | A1 * | 1/2012 | Tanioka | H01L 21/02332 438/765 |

FOREIGN PATENT DOCUMENTS

JP    4911263 B    1/2012

* cited by examiner

*Primary Examiner* — Kevin M Picardat
(74) *Attorney, Agent, or Firm* — Studebaker & Brackett PC

(57) ABSTRACT

When a gate insulating film is formed on a silicon carbide substrate, the silicon carbide substrate is first oxidized with an oxidation reactant gas to form the gate insulating film on the surface of the silicon carbide substrate. The silicon carbide substrate on which the gate insulating film has been formed is nitrided with a nitriding reactant gas. The oxidation and the nitriding are performed continuously in the same diffusion furnace while a temperature of 1200° C. to 1300° C. inclusive is maintained.

2 Claims, 2 Drawing Sheets

F I G. 3
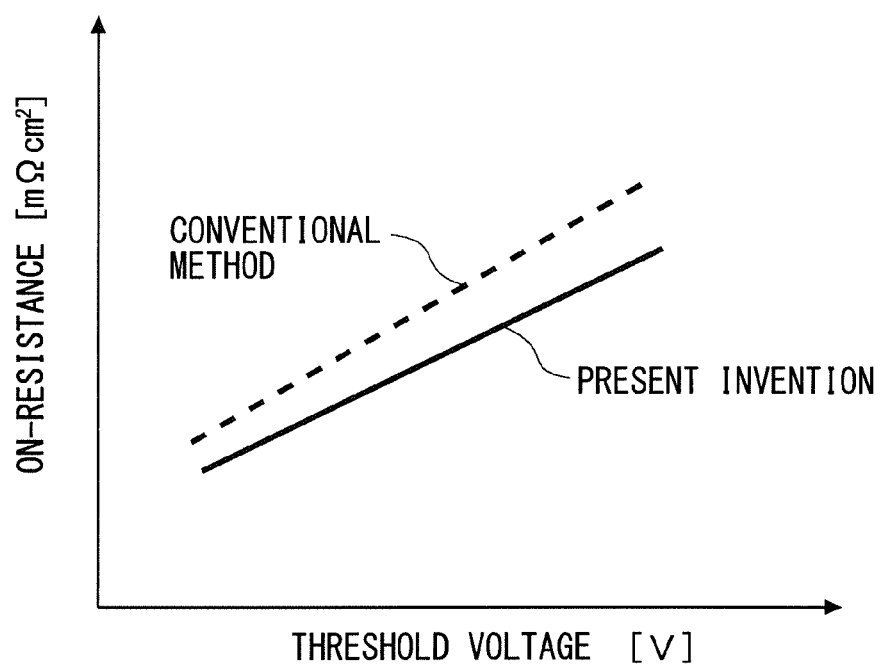

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device and, in particular, to a silicon carbide semiconductor device including a gate insulating film.

2. Description of the Background Art

A semiconductor element formed of silicon carbide (SiC) has recently attracted attention as a next generation high-withstand voltage, low-loss, high-heat resistant switching element, and is expected to be applied to a power semiconductor device, such as an inverter.

A vertical metal-oxide-semiconductor field-effect transistor (MOSFET) is well known as the power semiconductor device. When the MOSFET is formed of silicon carbide, a gate insulating film formed, for example, of silicon dioxide is required to be formed on a silicon carbide layer. The silicon dioxide film can be formed on the silicon carbide layer by a method of thermally oxidizing a surface part of the silicon carbide layer and a method of depositing the silicon dioxide film on the silicon carbide layer. In each of the methods, an interface state is formed at the interface between the silicon carbide layer and the silicon dioxide film. The interface state can act to make field-effect mobility of the MOSFET (SiC-MOSFET) formed of silicon carbide lower than that of silicon carbide bulk, increase resistance (on-resistance) during on-operation of the SiC-MOSFET, and consequently increase the loss of the SiC-MOSFET.

As a method for inactivating the interface state formed at the interface between silicon carbide and silicon dioxide, a method of, after formation of silicon dioxide on silicon carbide, treating them at a high temperature in a nitric oxide (NO) gas or a nitrous oxide ($N_2O$) gas is known. For example, Japanese Patent No. 4911263 discloses technology for nitriding the interface between silicon carbide and silicon dioxide by heating a substrate manufactured through formation of the silicon dioxide film on the silicon carbide layer to a temperature of 1200° C. to 1300° C. inclusive so that the substrate reacts with nitrogen. In particular, in Japanese Patent No. 4911263, a flow rate of a mixed gas of nitrogen and nitric oxide (with a mixing ratio of 1:1 to 9:1) introduced into a furnace is set to 0.75 slm or higher when an inside diameter of the furnace is 140 mm, and a position of the substrate is adjusted so that the mixed gas is retained in the furnace for 50 seconds or shorter. As a result, partial pressure of oxygen generated by reaction between nitric oxide and nitrogen is controlled to be 0.05 or lower of partial pressure of nitric oxide at a position near the substrate.

The on-resistance of the SiC-MOSFET is expected to be reduced with the technology disclosed in Japanese Patent No. 4911263. However, the SiC-MOSFET still has a high on-resistance compared to a MOSFET (Si-MOSFET) formed of silicon, and thus further reduction of the on-resistance is desired.

SUMMARY OF THE INVENTION

The present invention has been conceived to solve problems as described above, and aims to provide a silicon carbide semiconductor device having a reduced on-resistance.

A method for manufacturing a silicon carbide semiconductor device according to the present invention includes the steps of: oxidizing a silicon carbide layer with an oxidation reactant gas to form a gate insulating film on a surface of the silicon carbide layer; and then nitriding the silicon carbide layer with a nitriding reactant gas. The oxidation and the nitriding are performed continuously in the same treatment apparatus while a temperature of 1200° C. to 1300° C. inclusive is maintained.

The interface state formed at the interface between the silicon carbide layer and the gate insulating film is inactivated, allowing for reduction of the on-resistance of the silicon carbide semiconductor device. By performing oxidation and nitriding continuously in the same treatment apparatus while maintaining the temperature, a treatment time can be reduced, and an effect of reducing the influence of environmental foreign matters can be obtained. Furthermore, the characteristics of the silicon carbide semiconductor device can be stabilized by adding gas replacement of replacing the oxidation reactant gas with an inert gas after oxidation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for describing an (on-resistance reducing) effect of the silicon carbide semiconductor device according to embodiments of the present invention.

DESCRIPTION OF THE PREFERRED EMBODIMENTS

<Embodiment 1>

Figure 1:
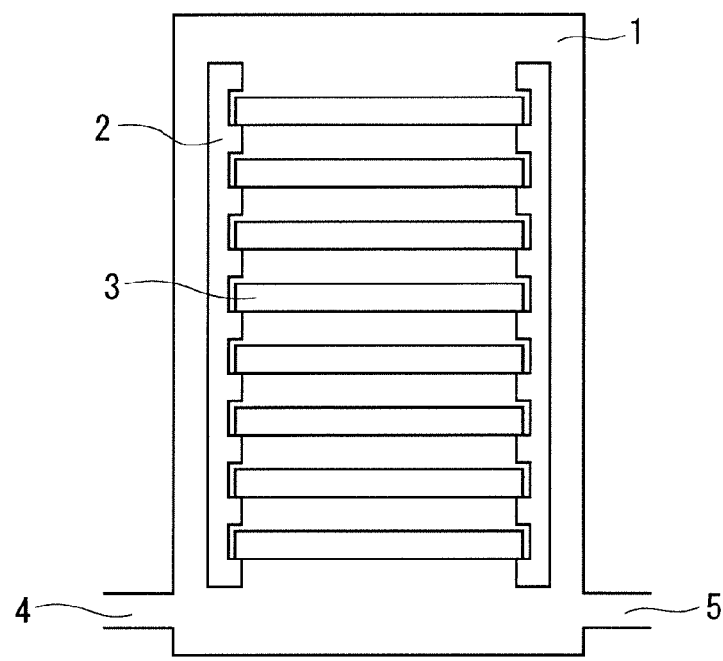
FIG. 1 schematically shows the structure of a treatment apparatus (furnace) for use in a method for manufacturing a silicon carbide semiconductor device according to embodiments of the present invention.

FIG. 1 schematically shows the structure of a treatment apparatus (furnace) for use in a method for manufacturing a silicon carbide semiconductor device according to Embodiment 1 of the present invention. In the present embodiment, a diffusion furnace 1 is used as the treatment apparatus.

In the diffusion furnace 1, oxidation to form a silicon dioxide film on the surface of a silicon carbide substrate 3 (silicon carbide layer) and nitriding to inactivate the interface state formed at the interface between the silicon carbide substrate 3 and the silicon dioxide film are performed. The silicon dioxide film is used as a gate insulating film of a silicon carbide semiconductor device, such as a MOSFET and an insulated-gate bipolar transistor (IGBT).

A supporting column 2 is provided in the diffusion furnace 1 to hold a plurality of silicon carbide substrates 3 to be subjected to oxidation and nitriding. The diffusion furnace 1 has a gas inlet 4 for introducing various types of gas for use in oxidation and nitriding into the diffusion furnace 1, and a gas outlet 5 for discharging the gas from the diffusion furnace 1.

Figure 2:
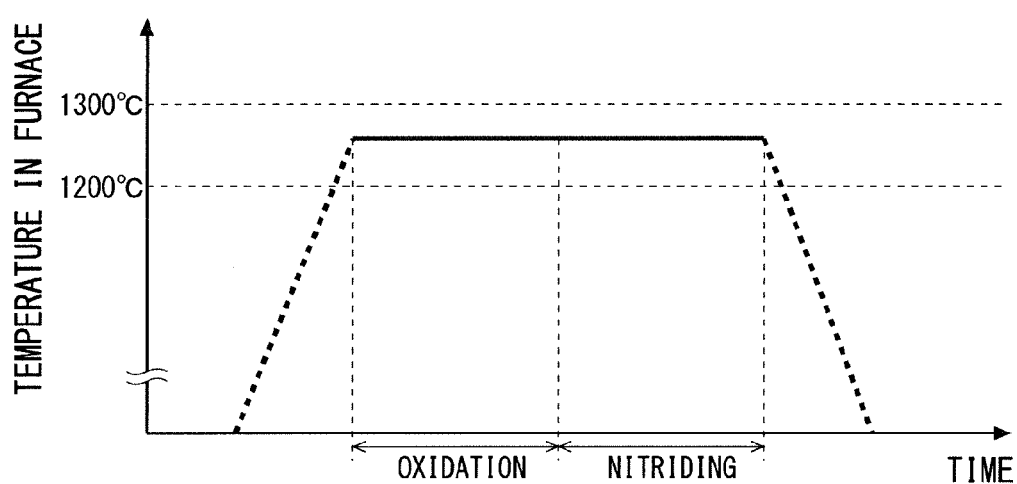
FIG. 2 shows a change in temperature in a diffusion furnace at the time of performing oxidation and nitriding in embodiments of the present invention.

The following describes the above-mentioned oxidation and nitriding performed in the manufacture of the silicon carbide semiconductor device according to the present embodiment. FIG. 2 shows a change in temperature in the diffusion furnace 1 at the time of performing the oxidation and nitriding.

First, the silicon carbide substrates 3 are held by the supporting column 2 to place the silicon carbide substrates 3 in the diffusion furnace 1 as shown in FIG. 1. A reactant gas (an oxidation reactant gas) necessary for oxidation and an inert gas are introduced from the gas inlet 4 into the diffusion furnace 1, and the inside of the diffusion furnace 1 is heated. In this case, the temperature in the diffusion furnace 1 is raised to a temperature of 1200° C. to 1300° C. inclusive as shown in FIG. 2. The temperature in the diffusion furnace 1 is maintained within a range of 1200° C. to 1300° C. inclusive until a silicon dioxide film (gate insulating film) of a desired thickness (e.g., 50 nm) is formed on each of the silicon carbide substrates 3.

Then, while the temperature in the diffusion furnace 1 is maintained within the range of 1200° C. to 1300° C. inclusive, a reactant gas (nitriding reactant gas) necessary for nitriding and an inert gas are introduced from the gas inlet 4 into the diffusion furnace 1, and an unnecessary gas used in oxidation is discharged from the gas outlet 5. As a result, treatment performed in the diffusion furnace 1 transitions from oxidation to nitriding. The interface state formed at the interface between the silicon carbide substrate 3 and the silicon dioxide film is inactivated through nitriding.

The temperature in the diffusion furnace 1 is also maintained within the range of 1200° C. to 1300° C. inclusive during nitriding. The temperature in the diffusion furnace 1 is preferably constant throughout oxidation and nitriding (i.e., oxidation and nitriding are performed at the same temperature) as shown in FIG. 2.

After nitriding is performed only for a predetermined time, the temperature in the diffusion furnace 1 is lowered, and then the silicon carbide substrate 3 is taken out of the diffusion furnace 1. A silicon carbide semiconductor device including the silicon dioxide film formed on the surface of the silicon carbide substrate 3 as the gate insulating film is then formed, but a method for forming the silicon carbide semiconductor device is not described as the silicon carbide semiconductor device is formed by the same method as that in conventional technology.

As described above, in the present embodiment, oxidation to form the silicon dioxide film on the silicon carbide substrate 3 and nitriding after oxidation are performed continuously in the same treatment apparatus (diffusion furnace 1) while the temperature is maintained. Compared to a conventional method in which oxidation and nitriding are performed separately, the interface state formed at the interface between silicon carbide and silicon dioxide can further be inactivated, and the on-resistance can be reduced.

FIG. 3 shows a comparison of the on-resistance of the SiC-MOSFET formed by the method in Embodiment 1 of the present invention with the on-resistance of the SiC-MOSFET formed by the conventional method in which oxidation and nitriding are performed separately. The comparison shows that the on-resistance of the SiC-MOSFET formed by the method according to the present invention is lower than that of the SiC-MOSFET formed by the conventional method by approximately 7% at the same threshold voltage.

<Embodiment 2>

In Embodiment 2, replacement (gas replacement) of an oxidation reactant gas used in oxidation with an inert gas (e.g., nitrogen gas and an argon gas) is performed between oxidation and nitriding in Embodiment 1. As described later, the temperature in the diffusion furnace 1 is also maintained within a range of 1200° C. to 1300° C. during gas replacement as in oxidation and nitriding. The change in temperature in the diffusion furnace 1 is substantially similar to that shown in FIG. 2.

The following describes the above-mentioned oxidation and nitriding performed in the manufacture of the silicon carbide semiconductor device according to the present embodiment.

First, the silicon carbide substrates 3 are held by the supporting column 2 to place the silicon carbide substrates 3 in the diffusion furnace 1 as shown in FIG. 1. A reactant gas (an oxidation reactant gas) necessary for oxidation and an inert gas are introduced from the gas inlet 4 into the diffusion furnace 1, and the inside of the diffusion furnace 1 is heated. In this case, the temperature in the diffusion furnace 1 is raised to a temperature of 1200° C. to 1300° C. inclusive as in Embodiment 1. The temperature in the diffusion furnace 1 is maintained within a range of 1200° C. to 1300° C. inclusive until a silicon dioxide film (gate insulating film) of a desired thickness (e.g., 50 nm) is formed on each of the silicon carbide substrates 3.

Then, replacement (gas replacement) of the oxidation reactant gas used in oxidation with an inert gas (e.g., nitrogen gas and argon gas) is performed. The temperature in the diffusion furnace 1 is also maintained within the range of 1200° C. to 1300° C. inclusive during gas replacement (the temperature in the diffusion furnace 1 is preferably maintained at the same temperature as that in oxidation). As a result of replacement of the oxidation reactant gas with the inert gas, the silicon carbide substrate 3 is heat treated in an inert gas atmosphere. The characteristics of the silicon carbide semiconductor device can be stabilized by performing heat treatment in the inert gas atmosphere after formation of the gate insulating film on the surface of the silicon carbide substrate 3.

The temperature in the diffusion furnace 1 is also maintained within the range of 1200° C. to 1300° C. inclusive after replacement of the oxidation reactant gas with the inert gas. Heat treatment in the inert gas atmosphere is performed for five to ten minutes, for example.

Then, while the temperature in the diffusion furnace 1 is maintained within the range of 1200° C. to 1300° C. inclusive, a reactant gas (nitriding reactant gas) necessary for nitriding and an inert gas are introduced from the gas inlet 4 into the diffusion furnace 1, and an unnecessary gas is discharged from the gas outlet 5. As a result, treatment performed in the diffusion furnace 1 transitions to nitriding. The interface state formed at the interface between the silicon carbide substrate 3 and the silicon dioxide film is inactivated through nitriding.

As in Embodiment 1, the temperature in the diffusion furnace 1 is also maintained within the range of 1200° C. to 1300° C. inclusive during nitriding. The temperature in the diffusion furnace 1 is preferably constant throughout oxidation, gas replacement (heat treatment in the inert gas atmosphere), and nitriding.

After nitriding is performed only for a predetermined time, the temperature in the diffusion furnace 1 is lowered, and then the silicon carbide substrate 3 is taken out of the diffusion furnace 1. A silicon carbide semiconductor device including the silicon dioxide film formed on the surface of the silicon carbide substrate 3 as the gate insulating film is then formed.

In Embodiment 2, an on-resistance reducing effect similar to that obtained in Embodiment 1 is obtained (the effect of reducing the on-resistance by approximately 7% was confirmed in experiments conducted by the inventors as shown in FIG. 3). This means that, in Embodiment 2, the effect of stabilizing the characteristics of the MOSFET can be obtained in addition to the effect obtained in Embodiment 1.

In each of Embodiments 1 and 2, the total time required for oxidation and nitriding is reduced by performing oxidation and nitriding continuously in the same treatment apparatus. Since no operation is performed by an operator between oxidation and nitriding, an effect of reducing the influence of environmental foreign matters can be also obtained.

Furthermore, variation in characteristics of the silicon carbide semiconductor device is expected to be reduced by performing oxidation and nitriding at the same temperature. This is because of the following reason: when oxidation and nitriding are performed at different temperatures, a temperature gradient in the diffusion furnace 1 and in the silicon carbide substrate 3 can change, and, especially when a nitrogen gas is used as the inert gas, a nitriding amount at the interface between the silicon carbide substrate 3 and the silicon dioxide film changes, and the change affects channel mobility of the silicon carbide semiconductor device.

There are techniques for nitriding the gate insulating film in the manufacture of a conventional power semiconductor device (Si device) formed of silicon (Si). These techniques, however, aim to improve the quality of the gate insulating film, and do not aim to improve mobility as in the present invention. This is because the Si device has a high mobility. That is to say, the present invention focuses on the problem specific to the silicon carbide semiconductor device, i.e., improvement of the mobility, and is essentially different from nitriding of the gate insulating film performed in the manufacture of the Si device.

Embodiments of the present invention can freely be combined, and can appropriately be modified and omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a silicon carbide semiconductor device, the method comprising the steps of:
   oxidizing a silicon carbide layer with an oxidation reactant gas to form a gate insulating film on a surface of said silicon carbide layer; and
   after said oxidizing, nitriding, with a nitriding reactant gas, said silicon carbide layer on which said gate insulating film has been formed, wherein
   said oxidizing and said nitriding are performed continuously in the same treatment apparatus while a constant temperature of 1200° C. to 1300° C. inclusive is maintained.

2. A method for manufacturing a silicon carbide semiconductor device, the method comprising the steps of:
   oxidizing a silicon carbide layer with an oxidation reactant gas to form a gate insulating film on a surface of said silicon carbide layer;
   after said oxidizing, performing gas replacement of replacing said oxidation reactant gas with an inert gas; and
   after said gas replacement, nitriding, with a nitriding reactant gas, said silicon carbide layer on which said gate insulating film has been formed, wherein
   said oxidizing, and said nitriding are performed continuously in the same treatment apparatus while a constant temperature of 1200° C. to 1300° C. inclusive is maintained.

* * * * *